United States Patent [19]

Miyazaki

[11] Patent Number: 5,463,197
[45] Date of Patent: Oct. 31, 1995

[54] APPARATUS AND METHOD FOR FORMING WIRE BONDING BALL

[75] Inventor: Naoki Miyazaki, Fukuoka, Japan

[73] Assignee: Mitsubishi Denki Kabushiki Kaisha, Tokyo, Japan

[21] Appl. No.: 258,574

[22] Filed: Jun. 10, 1994

[30] Foreign Application Priority Data

Jun. 30, 1993 [JP] Japan ................................. 5-162810

[51] Int. Cl.[6] ............................................. B23K 11/16
[52] U.S. Cl. ................................. 219/56.22; 219/56.21; 219/130.5; 219/130.21; 219/130.32
[58] Field of Search ........................ 219/56.21, 56.22, 219/130.5, 130.21, 130.32

[56] References Cited

U.S. PATENT DOCUMENTS

| | | | |
|---|---|---|---|
| 4,390,771 | 6/1983 | Kurtz et al. | 219/56.22 |
| 4,707,579 | 11/1987 | McKiel, Jr. | 219/56.22 |
| 5,110,032 | 5/1992 | Akiyama et al. | 219/56.21 |
| 5,212,361 | 5/1993 | Miyazaki et al. | 219/56.22 |
| 5,214,259 | 5/1993 | Terakado et al. | 219/56.22 |

Primary Examiner—Clifford C. Shaw
Attorney, Agent, or Firm—Leydig, Voit & Mayer

[57] ABSTRACT

A ball forming apparatus free from parameter variations introduced in setting spark discharge control parameters wherein the variations may be largely of operator-dependent or apparatus-dependent nature. To control discharge parameters, digital data for controlling discharge are transmitted in serial communications from a wire bonder controller to the ball forming apparatus, and the digital data are used to set parameters such as discharge current, discharge time, heat development and the like. The discharge state data acquired during spark discharge is transmitted in serial communications from the ball forming apparatus to the wire bonder controller so that the above parameters are used for feedback control. Irregularity or difference in the ball size that may vary from apparatus to apparatus is eliminated, and an improved bondability results. Unnecessary bondings are reduced, and an improved manufacturing efficiency in semiconductor field is achieved.

11 Claims, 8 Drawing Sheets

APPARATUS AND METHOD FOR FORMING WIRE BONDING BALL

BACKGROUND OF THE INVENTION

1. Field of the Invention

The present invention is directed to an apparatus for ball forming in semiconductor wire bonding, its control, and a wire bonder and, in particular, to a ball forming apparatus in which control parameters for spark discharge are set in digital data.

2. Description of the Related Arts

FIG. 7 is a block diagram showing the construction of a ball forming apparatus in a conventional wire bonder disclosed in Japanese Patent Application Laid-Open No. 57-39055. Designated at 1 in this figure is a wire for bonding, with one end (the lower end) of the wire passing through a capillary 2 downward. Disposed below the wire 1 is an electric torch electrode 3 from which a discharge takes place by applying high tension voltage to the lower end of the wire 1. The end of the wire 1 passes through a clamper 4 and runs upward so that the wire 1 is wound around a wire spool 5. Designated at 1a is a ball formed at the lower end of the wire 1 as a result of a spark discharge.

The conventional ball forming apparatus further comprises a discharge voltage generator circuit 6 for applying a high-tension voltage (2200 volts or higher, for example) between the electric torch electrode 3 and the lower end of the wire 1, a current setting potentiometer 7a, a discharge current supplying circuit 7 for supplying between the electric torch electrode 3 and the wire 1 a constant discharge current set by the current potentiometer 7a, a discharge time potentiometer 8a, a discharge time control circuit 8 for presetting or adjusting the discharge time of the discharge current supplying circuit 7, a driving circuit 9 for outputting a trigger signal to the discharge voltage generator circuit 6 and the discharge time control circuit 8 in response to the entry of a start signal from a wire bonder controller (not shown), a gap voltage detector circuit 10 for outputting a gap voltage signal S1 by detecting a gap voltage Vg between the electric torch 3 and the lower end of the wire 1, a discharge state determining circuit 11 for determining whether the voltage detected by the gap voltage detector circuit 10 is greater than or smaller than a reference value, and a determination result output circuit 12 for outputting a discharge state signal so that whether the discharge state is normal is presented on the display unit (not shown) of the wire bonder controller depending on the determination result provided by the determination result output circuit 12.

FIG. 8 is an enlarged view showing partially the wire end and the electric torch electrode before a ball forming phase (before spark discharge). FIG. 9 is an enlarged view showing partially the wire end and the electric torch electrode after a ball is formed (after spark discharge).

FIG. 10 is a timing diagram showing the timing of the operation of the conventional wire bonder. In FIG. 10, references A through D show the wire bonding timing of the wire 1 (chiefly, referring to the timing of extending wire to a semiconductor chip), the input timing of the start signal S9, the timing of ball forming, and the output timing of the determination result signal S10, respectively.

The operation of the conventional bonder is now discussed. When the start signal from the unshown wire bonder is input to the driving circuit 9, the driving circuit 9 in turn sends it to both the discharge voltage generator circuit 6 and the discharge time control circuit 8 to drive both circuits.

The discharge voltage generator circuit 6 generates a high-tension voltage (2200 volts or higher), causing a spark to take place between the end of the wire 1 and the electric torch electrode 3 2 thereby producing a discharge path. At the initiation of the spark, the discharge time control circuit 8 activates the discharge current supplying circuit 7 and continues operation for a fixed duration preset by the discharge time potentiometer 8a. The operation of the discharge current supplying circuit 7 causes a current, of which the magnitude is determined by the current setting potentiometer 7a, to flow through the discharge path formed between the end of the wire 1 and the electric torch electrode 3. The joule heat resulting from the current flow through the wire 1 for the fixed duration of time fuses the tip of the wire 1, producing a ball 1a thereon.

The discharge state determining circuit 11 determines whether the ball 1a has been successfully formed, in response to the gap voltage detector circuit 10 that picks up the gap voltage Vg during ball forming. The determination result as the output signal is sent from the determination result output circuit 12 to the wire bonder controller.

The conventional ball forming apparatus described above determines the discharge time and the magnitude of the discharge current for ball forming depending upon the size (diameter) of a required ball 1, a discharge gap length (the separation between the end of the wire 1 and the electric torch electrode 3) and other factors. Since the discharge gap length varies depending on feed rate variations of the wire 1, an operator adjusts in a analogue fashion the discharge time and the magnitude of discharge current by manually setting the discharge time potentiometer 8a and the current potentiometer 7a. Specifically, several useless test bondings are made on a trial and error basis, before the operator finally determines the discharge time and the discharge current based on the operator's own experience. Such a setting suffers from variations from apparatus to apparatus. Manually setting the discharge time potentiometer 8a and the current potentiometer 7a to precise settings is a difficult task, and the task itself is time-consuming and inefficient.

SUMMARY OF THE INVENTION

The present invention has been developed in view of the above problem. It is an object of the present invention to provide a ball forming apparatus, its control, and a wire bonder wherein variations due to differences between individual operators or between apparatus are eliminated by a wire bonder controller feedback control based on discharge state monitoring. Precision ball forming is performed without the influence of uncontrollable factors such as discharge gap length variations arising from variations in the feed rate of a bonding wire.

According to one aspect of the present invention, the ball forming apparatus comprises parameter setting means for digitally setting parameters that control spark discharge.

In one form of the invention, the parameter setting means comprises a serial communications control circuit for input/output control of serial input data that indicates ball forming conditions to a wire bonder controller and serial output data that represents a discharge state output.

In another form of the invention, the parameter setting means further comprises a discharge current setting circuit that converts the discharge current digital data included in the serial input data issued by the wire bonder controller into a discharge current instruction and outputs the instruction, and a discharge timer circuit that controls discharge time according to the discharge time digital data included in the serial input data.

In a further form of the invention, the parameter setting means further comprises a discharge current setting circuit that converts the discharge current digital data included in the serial input data issued by the wire bonder controller into a discharge current instruction and outputs the instruction, and a discharge heat control circuit that controls the heat that is developed in a wire during discharging according to the heat quantity data included in the serial input data.

In a further form of the invention, the ball forming apparatus further comprises a discharge state determining circuit that, by determining whether the discharge at a spark discharge is a successful spark discharge, a faulty discharge or a shorted wire, outputs the determination result to the serial communications control circuit, whereby the determination result is transmitted in serial output data from the serial communications control circuit to the wire bonder controller.

In a further form of the invention, parameters for controlling spark discharge are digital data.

In a further form of the present invention, the serial input data representing ball forming conditions and the serial output data representing the discharge state are serially communicated between the ball forming apparatus and the wire bonder controller that controls the operation of the ball forming apparatus.

In a further form of the invention, the discharge current digital data included in the serial input data issued by the wire bonder controller is converted into a discharge current instruction, the discharge current fed to the electric torch electrode is controlled based on the discharge current instruction, and the quantity of heat that is developed in the wire for bonding during discharging is controlled according to the heat quantity digital data included in the serial input data.

In a further form of the invention, a determination is made of whether the discharge at a spark discharge is a successful spark discharge, a faulty discharge or a shorted wire, and the determination result is transmitted in serial output data from the ball forming apparatus to the wire bonder controller.

According to another aspect of the invention, the wire bonder being a type of ball forming apparatus that forms a ball on the end of a wire by means of spark discharge with an electric torch electrode comprises a ball forming apparatus having parameters setting means for setting the parameter controlling spark discharge in digital data and a wire bonder controller that receives from the ball forming apparatus a spark discharge result of the ball forming apparatus, automatically modifies and controls the parameter controlling a subsequent spark discharge in accordance with the spark discharge result, and transmits in serial from the parameter thus modified to the ball forming apparatus as digital data.

Preferably, the wire bonder controller comprises means for modifying from outside the parameter controlling spark discharge.

DETAILED DESCRIPTION OF THE PREFERRED EMBODIMENTS

Embodiment 1

Figure 1:
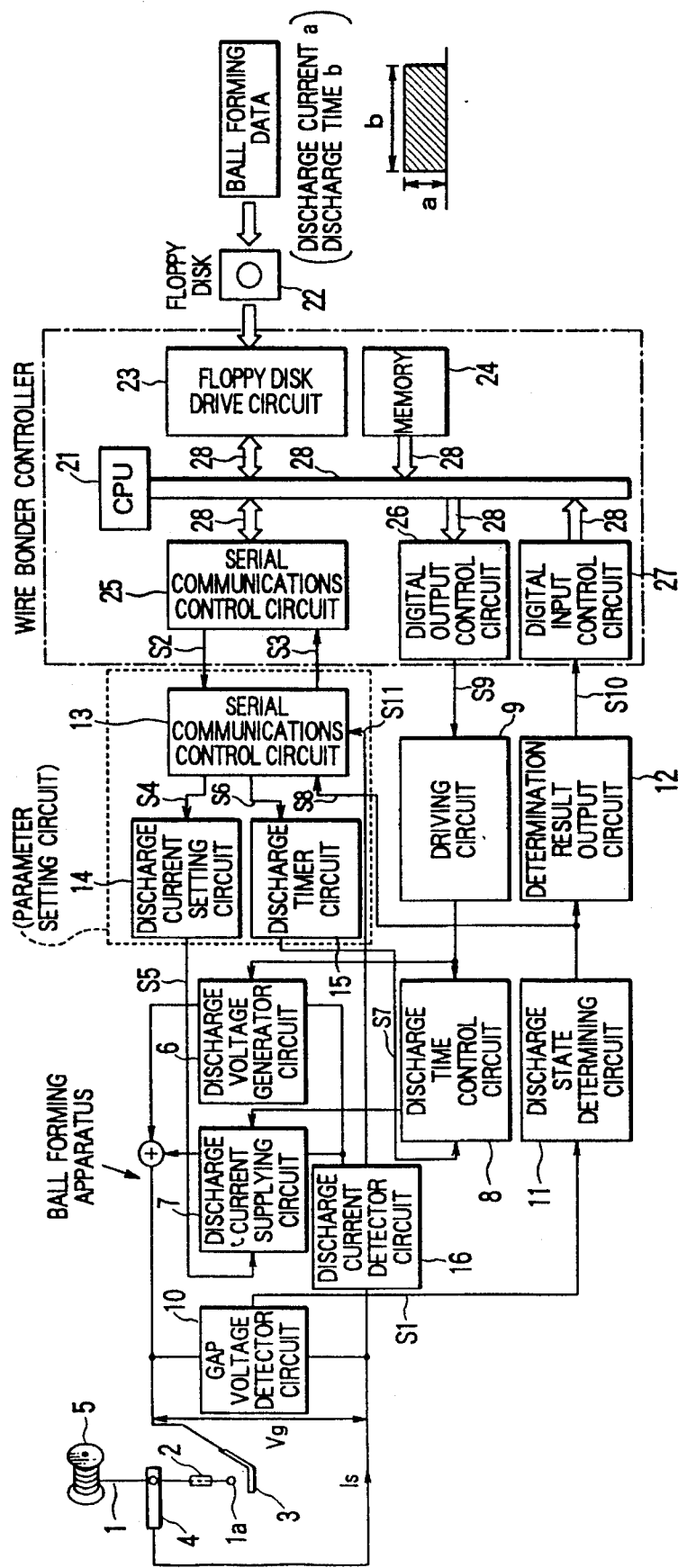
FIG. 1 is a block diagram showing the construction of a first embodiment of the wire bonder according to the present invention.
Figure 2:
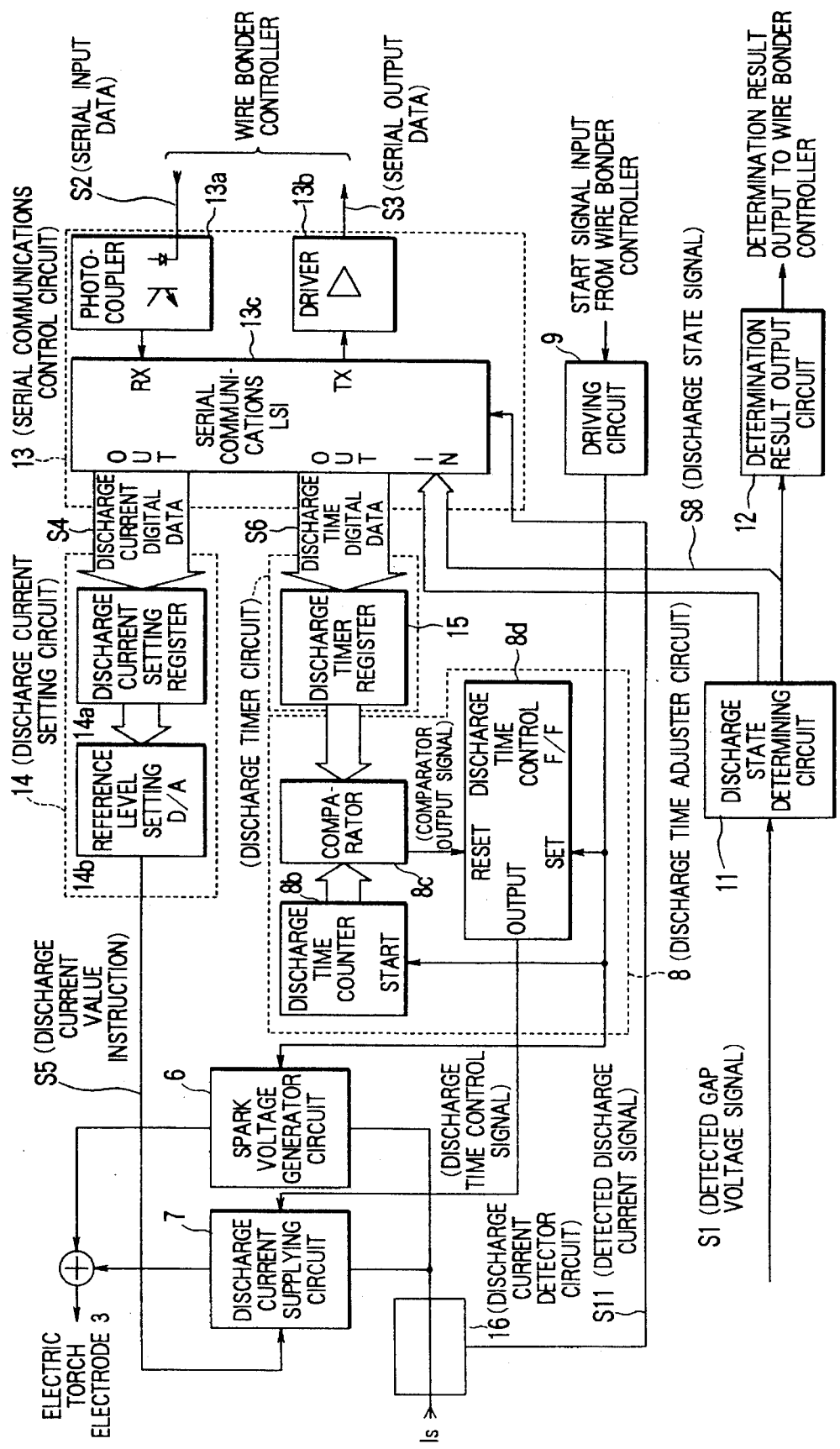
FIG. 2 is a block diagram illustrating in detail a part (torch power supply) of the ball forming apparatus of the wire bonder of FIG. 1.

Referring now to the drawings, the embodiments of the present invention are discussed. FIG. 1 is the block diagram showing the construction of the wire bonder including the ball forming apparatus according to the present invention and a wire bonder controller. FIG. 2 is a block diagram showing in detail the power supply circuit of the torch of the ball forming apparatus.

Figure 7:
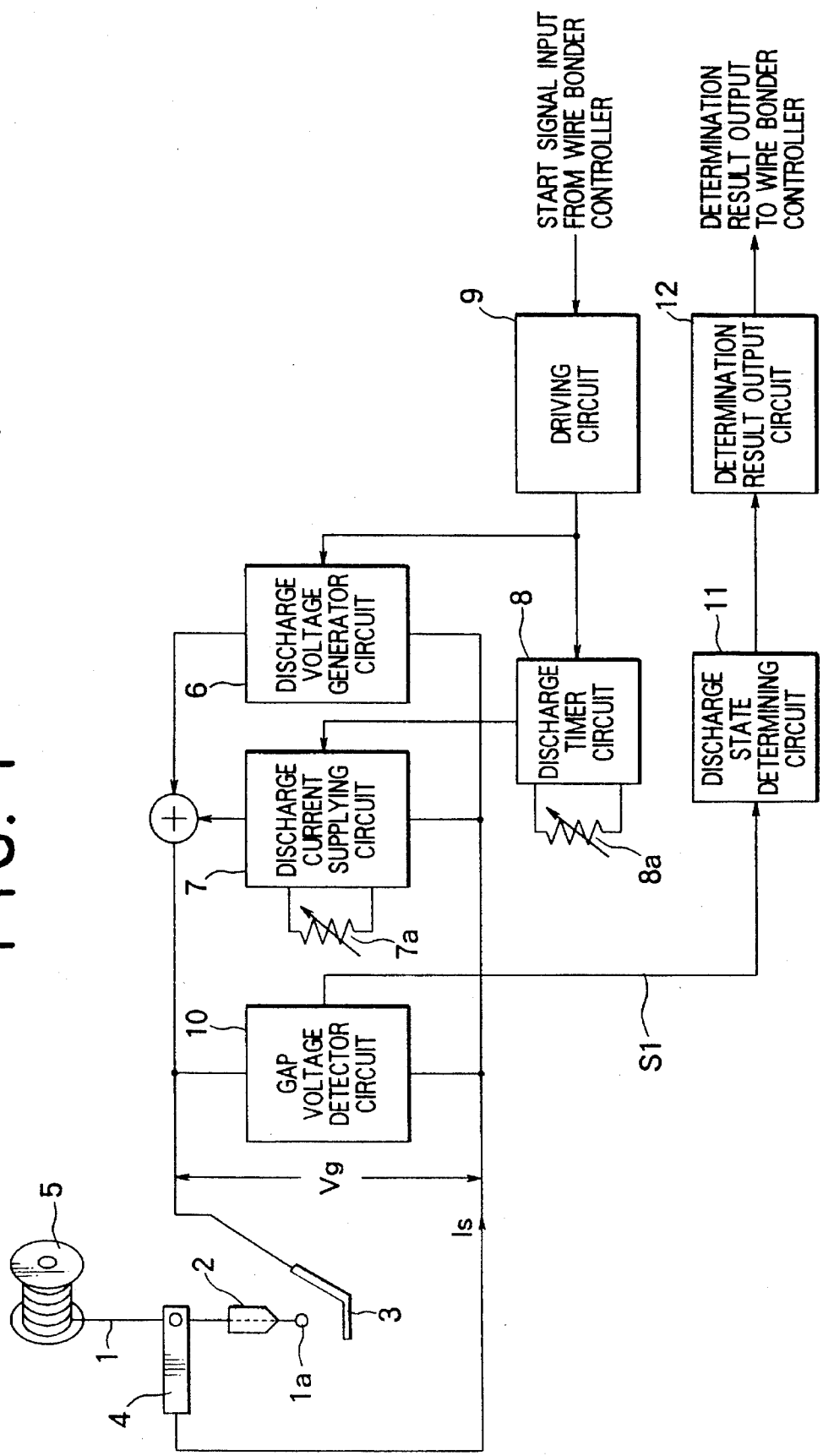
FIG. 7 is a block diagram showing the construction of a conventional ball forming apparatus.
Figure 8:
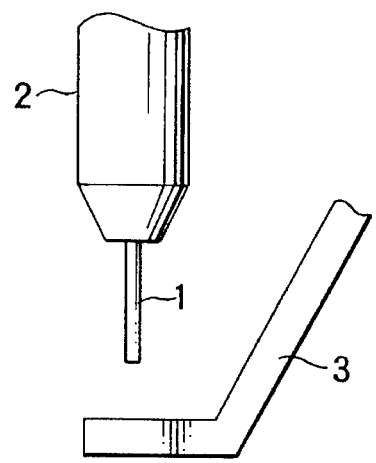
FIG. 8 is a side view showing the end of a wire and an electric torch electrode before a ball is formed.
Figure 9:
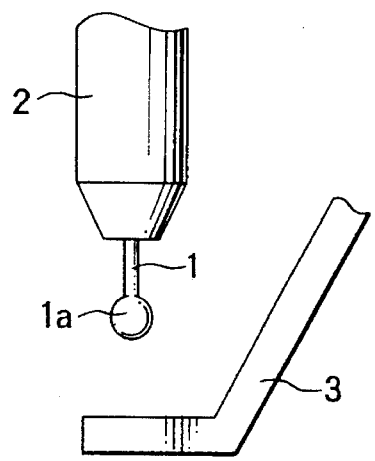
FIG. 9 is a side view showing the end of a wire and an electric torch electrode after a ball is formed.
Figure 10:
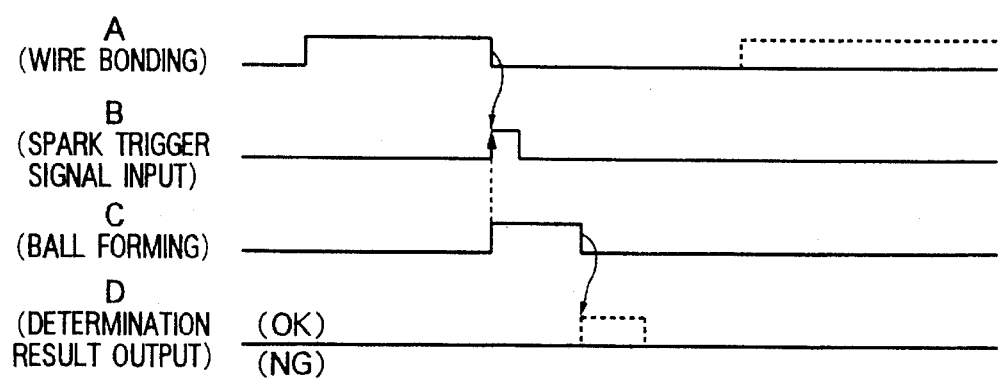
FIG. 10 is a timing diagram showing the operational timing of the conventional ball forming apparatus.

As seen from FIG. 1, the wire bonder according to the present invention comprises the ball forming apparatus and the wire bonder controller. In FIG. 1, those components equivalent to those described with reference to FIG. 7 are designated with the same reference numerals. However, unlike the conventional apparatus, the discharge current supplying circuit 7 and the discharge time control circuit 8 according to the present invention are not provided with their corresponding potentiometers, namely current setting potentiometer 7a and discharge time potentiometer 8a, respectively.

In addition to the components 1 through 12, the ball forming apparatus according to the present invention further comprises a serial communications control circuit 13 for input/output controlling a serial input data signal S2 that indicates ball forming conditions to the wire bonder controller and a serial output data signal S3 that represents discharge state output, a discharge current setting circuit 14 that converts the discharge current digital data S4 included in the serial input data S2 issued by the wire bonder controller into a discharge current instruction value S5 and outputs the value S5 to a discharge current supplying circuit 7, the discharge timer circuit 15 that converts a discharge time digital data S6 included in the serial input data S2 into a discharge time instruction value S7 and outputs the value S7 to the discharge time control circuit 8, and a discharge current detector circuit 16, connected to a clamper 4, for picking up the current flowing between a wire 1 and an electric torch electrode 3 during discharging in order to give a detected discharge current signal S11 to the serial communications control circuit 13, whereby a discharge state signal S8 output by the discharge state determining circuit 11 is issued to both a determination result output circuit 12 and the serial communications control circuit 13.

The serial communications control circuit 13, the discharge current setting circuit 14, and the discharge timer circuit 15 constitute parameter setting means for setting parameters that control spark discharge.

As shown in the detailed block diagram in FIG. 2, the serial communications control circuit 13 comprises a photo-coupler 13a for receiving the serial input data S2 from the wire bonder controller, a driver 13b for transmitting the serial output data S3 to the wire bonder controller, and a serial communications LSI 13c for receiving a signal from the photo-coupler 13a and for transmitting a signal to the driver 13c. The serial communications LSI 13c separates the serial input signal data S2 received via the photo-coupler 13a from a serial communications control circuit 25 into the digital discharge current data S4 and the digital discharge time data S6, both of which are sent to the discharge current setting circuit 14 and the discharge time control circuit 8, respectively.

The discharge current setting circuit 14 comprises a discharge current setting register 14a to which the discharge current digital data S4 is input from the serial communications LSI 13c, and a D/A converter 14b for digital-to-analog conversion of the discharge current digital data S4 into an analog signal. The discharge current digital data S4 fed to the discharge current setting register 14a is consequently converted to the discharge current instruction value S5 at the D/A converter 14b and the discharge current instruction S5 is then fed to a discharge current supplying circuit 7.

The discharge timer circuit 15 comprises a discharge timer register 14a that converts the discharge time digital data S6 fed by the serial communications LSI 13c into the discharge time instruction S7 and then outputs the instruction value S7.

The discharge time control circuit 8 comprises a discharge time counter 8b that initiates counting of a discharge time at the input of a trigger signal from a driving circuit 9, a comparator 8c that compares the output of the discharge timer register 15 with the output of the discharge time counter 8b and gives an output when the output of the discharge time counter 8b exceeds the output of the discharge timer register 15, and a discharge time control flip-flop 8d, that outputs a high-level signal at its output terminal to the discharge current supplying circuit 7 when the driving circuit 9 feeds a trigger signal to the set terminal of the flip-flop 8d, and the discharge time control flip-flop 8d is reset, transitioning its output signal from a high to low level when the comparator 8c feeds its output to the reset terminal of the flip-flop 8d.

The wire bonder controller comprises a central processor unit 21, a floppy disk drive circuit 23 for reading the data stored in a floppy disk 22, a memory 24 for storing the data read from the floppy disk 22, data computed by the CPU 21, and the program executed by the CPU 21, the serial communications control circuit 25 for serial data communications with the serial communications control circuit 13 of the ball forming apparatus, a digital output control circuit 26 for outputting to the driving circuit 9 a start signal S9 that causes the ball forming apparatus to start ball forming, and a digital input control circuit 27 to which the determination result output circuit 12 of the ball forming apparatus outputs a determination result signal S10, whereby the floppy disk drive circuit 23, the memory 24, the serial communications control circuit 25, the digital output control circuit 26 and the digital input control circuit 27 are all connected to the CPU 21 via a transmission bus 28. Data for ball forming such as a discharge current value a and a discharge time b are beforehand stored in the floppy disk 22.

The floppy disk drive circuit 23 has parameter modification means for updating from outside the parameter controlling spark discharge.

The serial input data S2 which the serial communications control circuit 25 of the wire bonder controller sends to the serial communications control circuit 13 of the ball forming apparatus are separately converted to parallel data, namely the discharge current digital data S4 and the discharge time digital data S6. The discharge current digital data S4 is converted by the discharge current setting circuit 14 to the discharge current instruction S5 which is then fed to the discharge current supplying circuit 7, and the discharge time digital data S6 is converted by the discharge timer circuit 15 to the discharge time instruction value S7 which is then fed to the discharge current control circuit 8. Thus, the discharge current potentiometer 7a and the discharge time potentiometer 8a, both of which need manual intervention by an operator to adjust discharge current and discharge time, are dispensed with.

Both the discharge current instruction S5 and the discharge time instruction S7 can be adjusted any time by modifying the serial input data S2. Settings for spark discharge can be corrected for each ball forming apparatus on an individual basis, by modifying the discharge current instruction S5 and the discharge time instruction S7 before the digital output control circuit 26 of the wire bonder controller feeds the start signal S9 to the driving circuit 9. This allows the ball size to be set for each ball forming apparatus on an individual basis.

During the ball forming process, the discharge state determining circuit gives spark discharge information such as "discharge in progress", "faulty discharge", "shorted wire" and the like. The spark discharge information is sent to the determination result output circuit 12. The spark discharge information is also sent to the serial communications control circuit 13 as the discharge state signal S8 which the serial communications control circuit 13 sends to the serial communications control circuit 25 of the wire bonder controller as the serial output data S3.

To determine a ball forming state, the wire bonder controller monitors the discharge state signal S8 which the serial communications control circuit 13 of the ball forming apparatus sends to the serial communications control circuit 25 as the serial output data S3, so that the wire bonder performs feedback control for ball forming by correcting the discharge current digital data S4 and the discharge time digital data S6.

Figure 3:
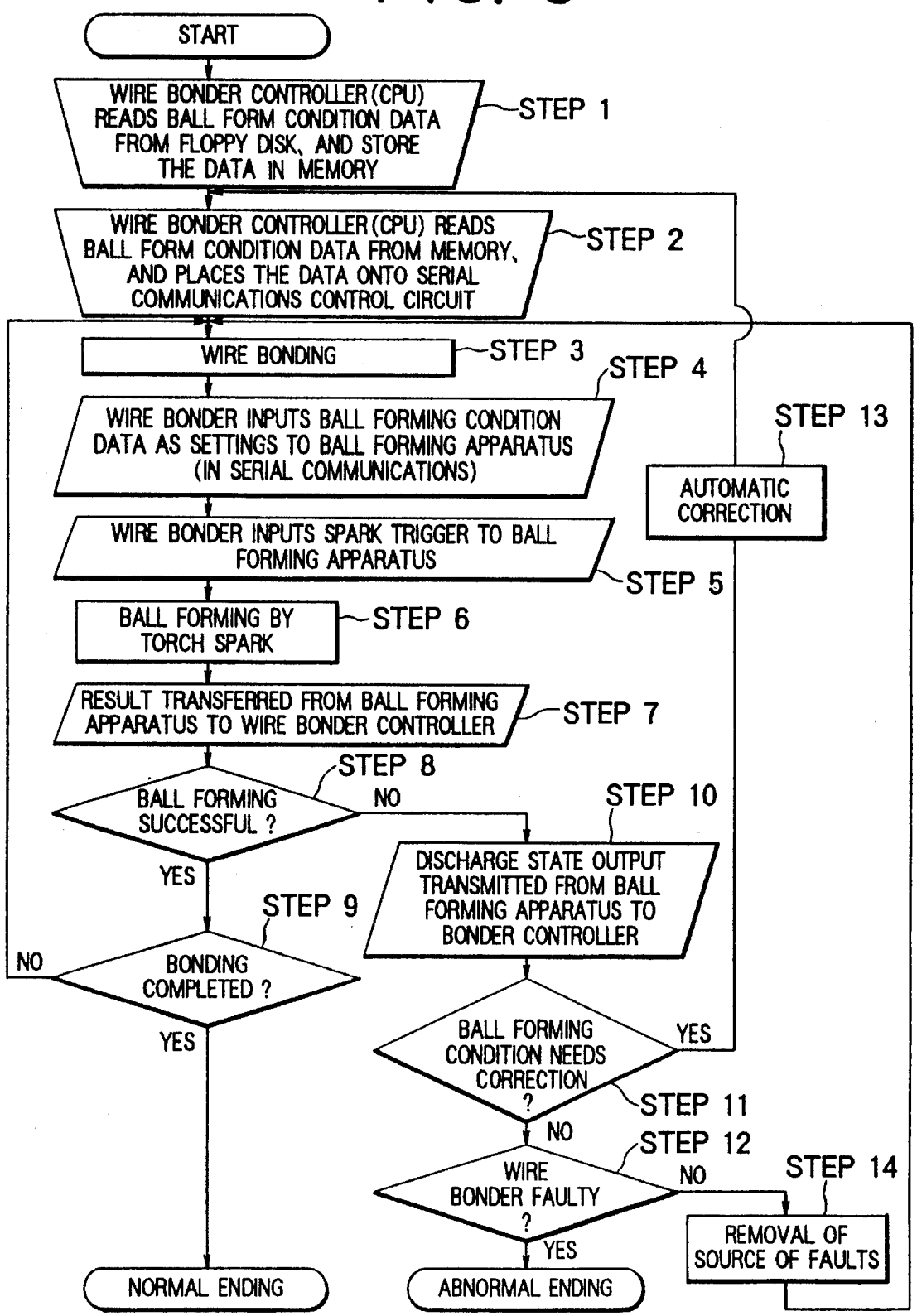
FIG. 3 is a flowchart showing the operational steps of the wire bonder of FIG. 1.
Figure 4:
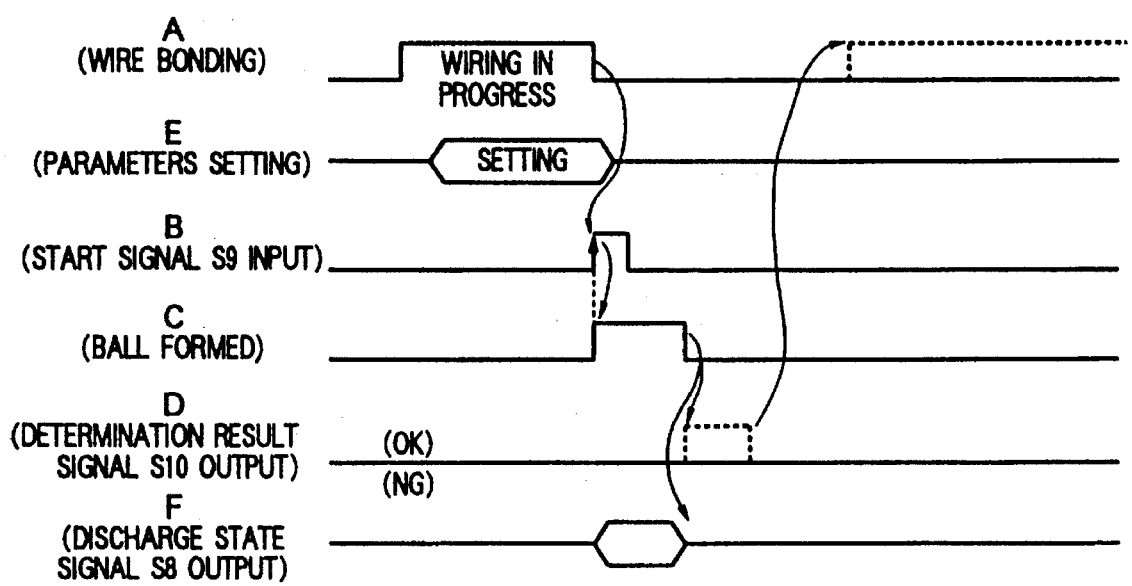
FIG. 4 is a timing diagram showing the operational timing of the wire bonder of FIG. 1.

FIG. 3 is the flowchart showing the operational steps of the wire bonder. FIG. 4 is a timing diagram showing the operational timing of the operation. In FIG. 4, references A through F show the wire bonding timing of the wire 1 (chiefly, referring to the timing of extending a wire to a semiconductor chip), the input timing of the start signal S9, the timing of ball forming, the output timing of the determination result signal S10, the output timing of settings (serial input data S2), and the output timing of the discharge state signal S8, respectively.

Referring now to the flowchart in FIG. 3 and the timing diagram in FIG. 4, the operation of the ball forming method using the apparatus is discussed.

As seen from the flowchart in FIG. 3, the CPU 21 of the wire bonder reads discharge current data and discharge time data from the floppy disk 22 that stores ball forming condition data (discharge current, discharge time) for the ball forming apparatus using the floppy disk drive circuit 23, and stores them into the memory 24 (step 1).

The CPU 21 reads the ball forming condition data stored in the memory 24, and then places the read data onto the serial communications control circuit 25 (step 2).

Next, using a prior art bonding control circuit (not shown), the clamper 4 is controlled to feed out the wire 1 from a wire spool 5 and to bond a wire onto a lead of a unshown semiconductor chip (corresponding to a square pulse A in FIG. 4) (step 3).

In the course of this wire bonding (wiring) phase, the serial communications control circuit 25 of the wire bonder controller sends the ball forming condition data S2 in a serial fashion to the serial communications control circuit 13. The serial communications control circuit 13 in turn converts the ball forming condition data S2 into the discharge current digital data S4 and the discharge time digital data S6, both of which are supplied to the discharge current setting circuit 14 and the discharge timer circuit 15, respectively (see E in FIG. 4) (step 4).

Upon completion of the wire bonding, the digital output control circuit 26 of the wire bonder controller transmits the start signal S9 to the ball forming apparatus (B in FIG. 4) (step 5).

In response to the start signal S9, as described in connection with the conventional apparatus in FIG. 7, the ball forming apparatus forms a ball 1a on the end of the wire 1 as a result of a series of ball sparking actions (C in FIG. 4) (step 6). In reference C, FIG. 4, the duration of the square pulse represents the time of the current flow.

Figure 5:
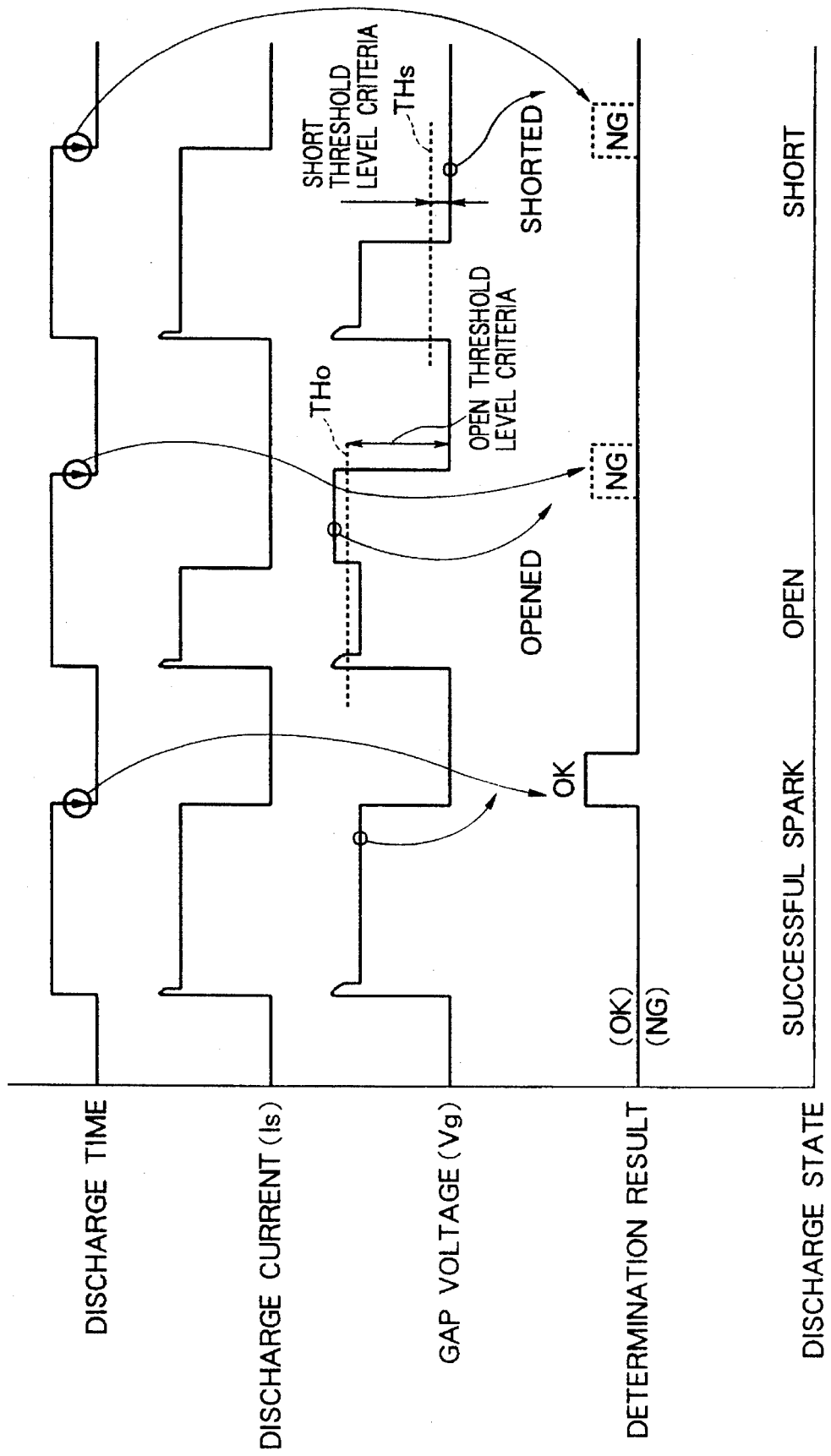
FIG. 5 is a diagram illustrating how the discharge state is determined in the ball forming apparatus according to the present invention.

In the course of ball forming (with a discharge current flowing), the discharge state determining circuit 11 determines each spark discharge based on the gap voltage criteria illustrated in FIG. 5, judging whether the spark discharge is a successful spark discharge state, an open (no discharge path formed due to excess gap length), a short state (short-circuit formed between the wire 1 and the electric torch electrode 3) (F in FIG. 4) (step 7). Specifically, the discharge state determining circuit 11 judges a spark discharge to be successful, producing a square pulse representing a determination result OK when a gap voltage Vg in discharge is, throughout a discharge time, lower than the upper threshold Tho but higher than the lower threshold THs. The discharge state determining circuit 11 judges a spark discharge state to be open when a discharge current IS flows transiently and when a gap voltage Vg exceeds the upper threshold Tho within a discharge time. The discharge state determining circuit 11 judges a spark discharge to be a short state when a gap voltage Vg occurs transiently at first and thereafter remains lower than the lower threshold THs.

The determination result output circuit 12 then outputs the determination result signal S10 indicative of this result to the digital input control circuit 27 of the wire bonder controller (D in FIG. 4) (step 8).

The wire bonder controller receives the determination result signal S10 issued from the ball forming apparatus and, then based on this signal, judges whether the ball forming is successful (step 8).

When the ball forming is successful, a judgement is made of whether a required number of bonds is completed (step 9). If the required number of bondings is completed, the wire bonding operation normally ends. If not completed, the wire bonder returns to step 3 for making subsequent bonds.

When the ball forming is judged to be unsuccessful at step 8, the serial communications control circuit 13 of the ball forming apparatus sends in a serial fashion the discharge state signal S8 representing the discharge current status, gap voltage status, and ball forming determination result to the serial communications control circuit 25 of the wire bonder controller (F in FIG. 4) (step 10).

The CPU 21 of the wire bonder controller reads from the serial communications control circuit 25 the discharge current status, the gap voltage status, the ball forming determination result and the like, and determines whether a modification of the ball forming conditions is required (step 11). This determination is performed as follows, for example: When the product of the discharge current value, the gap voltage value and the discharge time exceeds a predetermined value, no correction is required. If the product fails to reach the predetermined value, correction is required.

When no correction is required in the ball forming conditions in the determination at step 11, the wire bonder itself (mechanical components such as the wire 1, a capillary 2, the electric torch electrode 3, the clamper 4, the wire spool 5 and the like except the torch power supply) is checked for any fault. This check is performed by detecting any out-of-tolerance values in discharge current or gap voltage.

When the need for correction in settings of ball forming conditions is recognized at step 11, the ball forming condition data (discharge current value, discharge time and the like) are automatically corrected (step 13), and then the process returns to step 2.

As an example, an automatic correction method of the ball forming condition data is carried out as follows: When the gap voltage that is read from the serial communications control circuit 25 after being picked up by a gap voltage detector circuit 10 is found to be higher than the normal discharge voltage level, the ball size is expected to increase; thus, to correct the ball size, the ball forming condition data is modified by lowering the discharge current setting or shortening the discharge time setting and then modified data are stored in the memory 24.

When any fault (out-of-tolerance values in discharge current or gap voltage) is detected in the wire bonder main unit at step 12, the wire bonder itself needs to be switched off (abnormal ending) for fault finding.

When no fault is detected in the wire bonder main unit at step 12 (discharge current, gap voltage and the like being as per rated), that abnormal ball forming is attributable to transient factors (for example, faults involved in wire feeding, such as a trace of dirt on the wire 1, a bent wire 1, or dirt on the capillary (i.e., sticking solder residues)). These transient factors are removed (step 14), and then the process returns to step 3 for a subsequent wire bond.

Embodiment 2

Figure 6:
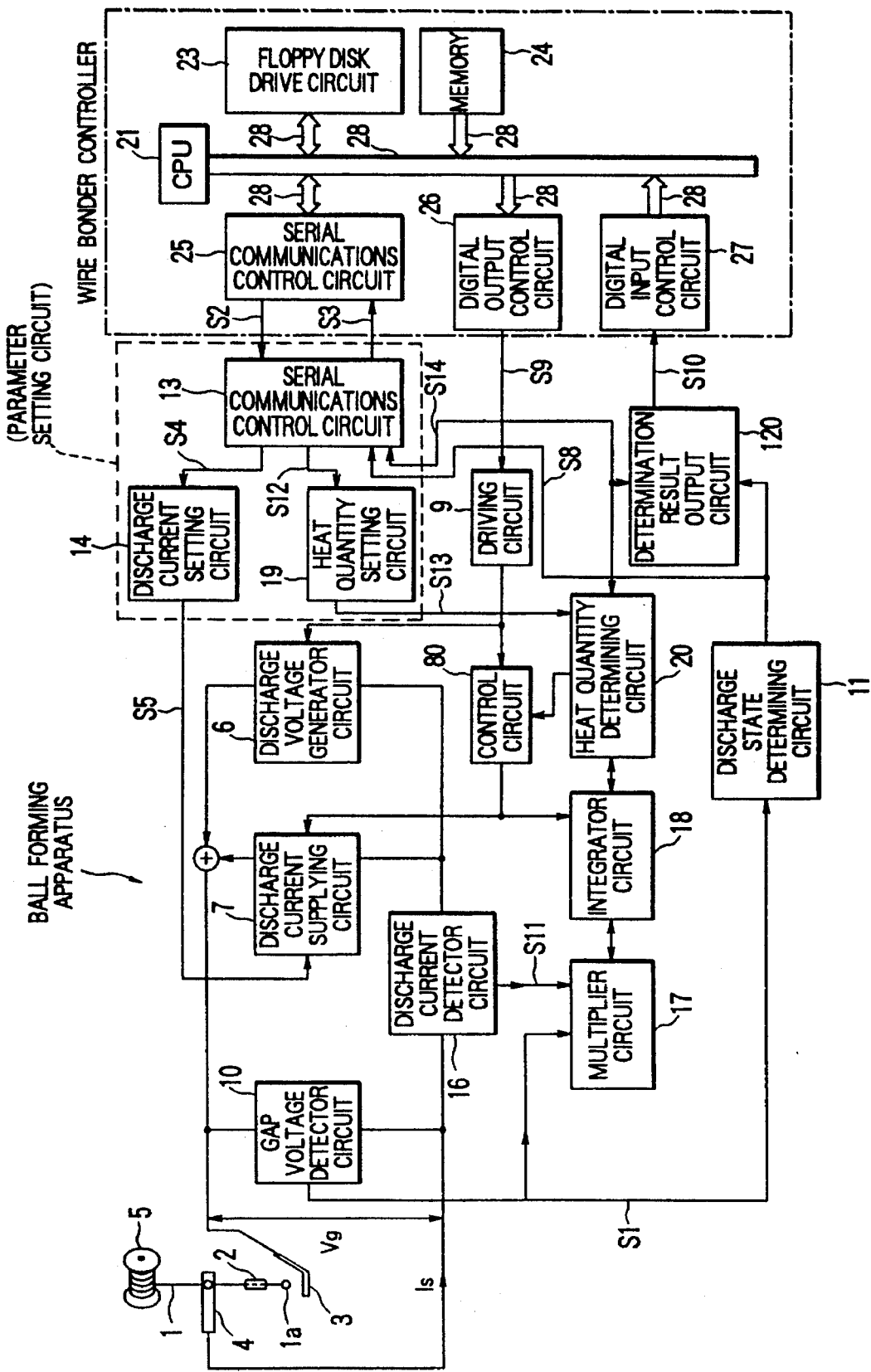
FIG. 6 is a block diagram showing the construction of the second embodiment of the wire bonder according to the present invention.

FIG. 6 is a block diagram showing the second embodiment of the present invention. In this embodiment, the present invention is applied to the ball forming apparatus in which ball forming is carried out while monitoring developed heat. The second embodiment utilizes developed heat and discharge current in a discharge process as control parameters. The wire bonder controller sets these parameters in digital data.

As seen from FIG. 6, the construction of the second embodiment of the ball forming apparatus is identical to that of the first embodiment in FIG. 1, except as described below. In FIG. 6, those components equivalent to those described with reference to FIG. 1 are designated with the same reference numerals.

The second embodiment of the present invention comprises, instead of the discharge timer circuit 15 in the first embodiment, a multiplier 17 connected to the gap voltage detector circuit 10 and the discharge current detector circuit 16, for multiplying the gap voltage detector signal S1 detected by the gap voltage detector circuit 10 by the discharge current signal S11 detected by the discharge current detector circuit 16 and for outputting the resulting product. An integrator circuit 18 calculates heat quantity developed during discharge by integrating the output from the multiplier 17 during the discharge time set by a control circuit 80, a heat quantity setting circuit 19 converts to a heat quantity instruction value S13 the heat quantity digital data S12 that is received in serial communications via the a serial communication control circuit 25 and the serial communications control circuit 13 from the wire bonder controller, and a heat quantity determining circuit 20 outputs a high-level signal, to determine whether a sufficient heat quantity has been developed for ball forming. When the output of the integrator circuit 18 is greater than the heat quantity instruction value S13 provided by the heat quantity setting circuit 19, or outputs a low-level signal when the output of the integrator circuit 18 is smaller that the instruction value S13, whereby each of the high-level signal and the low-level signal is fed to each of the driving circuit 9, the determination result output circuit 12, and the serial communications control circuit 13.

In this embodiment, the discharge current detector circuit 16, the multiplier circuit 17, the integrator circuit 18, the heat quantity setting circuit 19, and the heat quantity determining circuit 20 are part of a discharge heat quantity control circuit that controls the heat developed in the wire 1 in response to the heat quantity digital data S12 included in the serial input data S2. The discharge heat setting circuit 19, the serial communications control circuit 13 and the discharge current setting circuit 14 are part of parameter setting means that sets in digital data the parameter that controls spark discharge.

In this embodiment, the control circuit 80 includes, for example, a flip-flop. When the output signal of the driving circuit 9 is fed to the set terminal of the flip-flop, the flip-flop outputs a high-level signal to the discharge current supplying circuit 7 and the integrator circuit 18 to cause both the discharge current supplying circuit 7 and the integrator circuit 18 to operate. At the moment the output of the integrator circuit 18 (the heat developed in a discharge) exceeds the heat quantity instruction value S13 of the heat quantity setting circuit 19, the heat quantity determining circuit 20 feeds a high-level signal to the reset terminal of the control circuit 80, driving low the output of the control circuit 80, consequently deactivating the discharge current supplying circuit 7 and the integrator circuit 18. The discharge time of the discharge current supplying circuit 7 and the integrating time of the integrator circuit 18 are thus controlled.

In this embodiment, the determination result output circuit 120 replaces the determination result output circuit 12 in the first embodiment. The determination result output circuit 120 is provided with the discharge state signal S8 by the discharge state determining circuit 11 and with the heat quantity state signal S14 by the heat quantity determining circuit 20. The determination result output circuit 120, as does the determination result output circuit 20 in the first embodiment, determines the discharge state (a successful spark discharge, an open state or a short state) by comparing the output (gap voltage) of the discharge state determining circuit 11 with the upper threshold Tho and the lower threshold Ths. In addition, the determination result output circuit 120 determines the ball state (size) by judging whether the heat developed during discharge is greater than the heat quantity instruction value S13, based on the output signal the heat quantity determining circuit 20 provides. The determination result output circuit 120 gives its output in digital signal from to the digital input control circuit 27 of the wire bonder controller.

The gap voltage signal S8 output by the discharge state determining circuit 11 and the heat quantity state signal S14 output by the heat quantity determining circuit 20 are sent to the serial communications control circuit 13 from which both signals as the serial output data S3 are fed to the serial communications control circuit 25 of the wire bonder controller to be used as data in automatic correction of ball forming.

On the other hand, heat quantity values and discharge current values for ball forming that are stored in the memory 24 after being read from a floppy disk by means of the disk drive circuit 23, are transferred to the serial communications control circuit 13 from the serial communications control circuit 25 as the serial input data S2. The serial communications control circuit 13 in turn separates the discharge current digital data S4 from the heat quantity digital data S12. The discharge current digital data S4 and the heat quantity digital data S12 are sent, respectively, to the discharge current setting circuit 14 and the heat quantity setting circuit 19, where both data S4 and S12 are converted to a discharge current instruction value S5 and a heat quantity instruction value S13, respectively. The discharge current instruction value S5 and the heat quantity instruction value S13 are then fed to the discharge current supplying circuit 7 and the heat quantity determining circuit 20, respectively.

The remainder of the construction and operation of the second embodiment remains unchanged from that of the first embodiment.

As discussed above, the present invention comprises parameter setting means that allows the parameters controlling spark discharge to be set in digital data. Setting the parameters in digital from eliminates setting variations that would take place if operators manually set the parameters in a conventional and analogue fashion, such variations possibly varying from operator to operator and from apparatus to apparatus. Thus, the irregularity in the ball size due to difference from apparatus to apparatus is eliminated, and thus an improved bondability results.

According to the present invention, the wire bonder allows feedback control by monitoring discharge state. Precision ball forming is constantly performed without the influence of uncontrollable factors, such as discharge gap length variations arising in the feed rate of a bonding wire, variations which may be different from apparatus to apparatus. This reduces unnecessary trial bonding, thereby achieving an improved manufacturing efficiency and a reduced manufacturing cost.

Since different ball sizes are allowed for different wires on an individual wire basis on a semiconductor chip in wire bonding operations, the present invention offers a ball forming apparatus which is adaptable to a variety of applications and is flexible enough to accommodate any semiconductor chips manufactured in the future.

What is claimed is:

1. A ball forming apparatus for forming a ball on an end of a wire in a spark discharge comprising:

an electrode for supporting an electrical discharge across a gap between the electrode and an end of a wire;

a discharge voltage generator circuit electrically connected to the electrode and the wire for generating a voltage for establishing a spark discharge between the electrode and the wire;

a discharge current supplying circuit electrically connected to the electrode and the wire for supplying current flowing between the electrode and the wire during a spark discharge;

a gap voltage detector circuit electrically connected to the electrode and the wire for detecting a voltage between the electrode and the wire during a spark discharge;

a discharge state determining circuit connected to the gap voltage detector circuit for a determination of whether a spark discharge is a successful spark discharge, a faulty discharge, or whether the electrode is short-circuited to the wire, and for generating an output signal indicative of the determination; and a parameter setting circuit for receiving, in digital form, parameters for controlling a spark discharge including discharge current, the parameter setting circuit including a discharge current setting circuit connected to the discharge current supplying circuit for controlling the current supplied to the electrode and the wire during a spark discharge.

2. The ball forming apparatus according to claim 1 wherein the parameter setting circuit comprises a serial communications control circuit for controlling a serial input data signal that includes the parameters for controlling spark discharge and that produces a serial output data signal indicating a result of a spark discharge.

3. The ball forming apparatus according to claim 1 wherein the parameter setting circuit comprises a discharge heat quantity setting circuit coupled to the discharge current supplying circuit for controlling heat energy dissipated during a spark discharge wherein heat energy, digital form, is one of the parameters.

4. The ball forming apparatus according to claim 3 including:

a heat quantity determining circuit coupling the heat quantity setting circuit to the discharge current supplying circuit for controlling the current supplied to a spark discharge;

a discharge current detector circuit electrically connected to the wire for detecting the current flowing in a spark discharge;

a multiplier circuit connected to the gap voltage detector circuit and the discharge current detector circuit for multiplying the instantaneous current and voltage of a spark discharge to produce a heat signal;

an integrator circuit receiving the heat signal from the multiplier circuit for integrating the heat signal to produce a heat energy signal indicative of the total heat energy dissipated in a spark discharge, the integrator circuit being connected to the heat quantity determining circuit for controlling the current flowing in a spark discharge, the heat quantity determining circuit being connected to the parameter setting circuit for adjusting the heat quantity setting circuit in response to the heat energy dissipated in a spark discharge.

5. The ball forming apparatus according to claim 1 wherein the discharge current setting circuit includes a discharge current setting register for receiving a digital discharge current signal and a digital-to-analog converter connected to the register for producing an analog current controlling signal supplied to the discharge current supplying circuit.

6. The ball forming apparatus according to claim 1 wherein the parameters for controlling spark discharge include discharge time and the parameter setting circuit includes a discharge timer circuit coupled to the discharge current supplying circuit for controlling spark discharge duration.

7. The ball forming apparatus according to claim 1 including a discharge current detector circuit electrically connected to the wire for detecting the current flowing in a spark discharge and connected to the parameter setting circuit for adjusting the discharge current setting circuit after a spark discharge and wherein the discharge state determining circuit is connected to the parameter setting circuit for responding to the determination.

8. A method for controlling formation of a ball at the end of a wire in a spark discharge comprising:

establishing in digital form parameters for controlling a spark discharge between an electrode and an end of a wire, the parameters including digital discharge current data indicative of a controlled discharge current flowing between the electrode and the wire in a spark discharge;

converting the digital discharge current data into an analog discharge current control signal for controlling the discharge current in a spark discharge; and using the analog discharge current control signal, controlling the current flowing between an electrode and a wire in a spark discharge to produce a ball at an end of the wire.

9. The control method according to claim 8 wherein the parameters include digital heat energy data indicative of a controlled heat energy dissipated in a spark discharge and comprising converting the digital heat energy data into an analog heat energy control signal and, using the analog heat energy control signal, controlling the heat energy dissipated during a spark discharge.

10. The control method according to claim 8 comprising determining whether a discharge is a successful spark discharge, a faulty discharge, or a shorted-wire and transmitting the determination as serial output data to a wire bonder controller.

11. The control method according to claim 8 wherein the parameters include digital discharge time data indicative of discharge duration of a spark discharge and comprising converting the digital discharge time data into an analog discharge time signal and, using the analog discharge time signal, controlling duration of a spark discharge.

\* \* \* \* \*